United States Patent
Jeon et al.

(10) Patent No.: US 9,082,693 B2
(45) Date of Patent: Jul. 14, 2015

(54) NITRIDE SEMICONDUCTOR BASED POWER CONVERTING DEVICE

(71) Applicant: Samsung Electronics Co., Ltd., Suwon-Si, Gyeonggi-Do (KR)

(72) Inventors: Woo-chul Jeon, Daegu (KR); Baik-woo Lee, Gwangmyeong-si (KR); Jai-kwang Shin, Anyang-si (KR); Jae-joon Oh, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 49 days.

(21) Appl. No.: 13/921,466

(22) Filed: Jun. 19, 2013

(65) Prior Publication Data

US 2014/0091311 A1    Apr. 3, 2014

(30) Foreign Application Priority Data

Sep. 28, 2012  (KR) ........................ 10-2012-0109274

(51) Int. Cl.
*H01L 31/0328*  (2006.01)
*H01L 29/205*  (2006.01)

(52) U.S. Cl.
CPC .................................. *H01L 29/205* (2013.01)

(58) Field of Classification Search
USPC ........... 257/192, 194, 195, E29.089, E29.246
See application file for complete search history.

(56) References Cited

U.S. PATENT DOCUMENTS

| | | | |
|---|---|---|---|
| 6,903,383 B2 * | 6/2005 | Yokogawa et al. | 257/192 |
| 2003/0104669 A1 | 6/2003 | Eppich et al. | |
| 2006/0214289 A1 | 9/2006 | Hansen | |
| 2006/0289963 A1 * | 12/2006 | Asano et al. | 257/506 |
| 2009/0026499 A1 * | 1/2009 | Kikawa et al. | 257/194 |
| 2009/0058532 A1 | 3/2009 | Kikkawa et al. | |
| 2011/0062579 A1 | 3/2011 | Mishra et al. | |
| 2012/0061680 A1 | 3/2012 | Lee et al. | |
| 2014/0015591 A1 * | 1/2014 | Chen et al. | 327/380 |
| 2014/0042495 A1 * | 2/2014 | Parikh et al. | 257/195 |

* cited by examiner

*Primary Examiner* — Matthew E Warren
(74) *Attorney, Agent, or Firm* — Harness, Dickey & Pierce, P.L.C.

(57) ABSTRACT

A nitride semiconductor based power converting device includes a nitride semiconductor based power transistor, and at least one nitride semiconductor based passive device. The passive device and the power transistor respectively include a channel layer including a first nitride semiconductor material, and a channel supply layer on the channel layer including a second nitride semiconductor material to induce a 2-dimensional electron gas (2DEG) at the channel layer. The passive device may be a resistor, an inductor, or a capacitor.

16 Claims, 5 Drawing Sheets

NITRIDE SEMICONDUCTOR BASED POWER CONVERTING DEVICE

CROSS-REFERENCE TO RELATED APPLICATIONS

This application claims the benefit of Korean Patent Application No. 10-2012-0109274, filed on Sep. 28, 2012 in the Korean Intellectual Property Office, the disclosures of which are incorporated herein in their entirety by reference.

BACKGROUND

1. Field

Some example embodiments relate to nitride semiconductor based power converting devices, and more particularly, to nitride semiconductor based power converting devices in which a power switching device and a passive device are formed on the same layer.

2. Description of the Related Art

Various power converting devices require devices for controlling flows of currents via ON/OFF switching, that is, power devices. The overall efficiency of a power converting device may depend on efficiency of a power device.

The most popular power devices currently being commercialized include a silicon (Si) based power metal oxide semiconductor field effect transistor (MOSFET) and an insulated gate bipolar transistor (IGBT). However, due to limits of material properties of silicon and limits in manufacturing processes, it is difficult to further improve efficiency of a Si-based power device. Recently, to resolve the problem, research is being conducted and developments are being made for improving power converting efficiency by applying Group III-V compound semiconductors to power devices. In relation thereto, a high electron mobility transistor (HEMT) using heterojunction of semiconductors is being spotlighted.

A HEMT includes semiconductor layers having different electric polarization characteristics. In a HEMT, a semiconductor layer having a relatively high electric polarization may induce 2-dimensional electron gas (2DEG) at an adjacent semiconductor layer, where the 2DEG may have high electron mobility.

A power converting device includes a HEMT and passive devices, such as a resistor, an inductor, and a capacitor. Structure of a power converting device may be simplified by integrating such passive devices together with a HEMT as a nitride semiconductor.

SUMMARY

Some example embodiments provide power converting device including a power transistor and passive devices that are fabricated together by using nitride semiconductors.

Additional aspects will be set forth in part in the description which follows and, in part, will be apparent from the description, or may be learned by practice of example embodiments.

According to an example embodiment, a nitride semiconductor based power converting device includes a nitride semiconductor based power transistor and at least one nitride semiconductor based passive device.

The at least one nitride semiconductor based passive device may be one of a resistor, an inductor, and a capacitor. The at least one nitride semiconductor based passive device and the nitride semiconductor based power transistor may include a channel layer including a first nitride semiconductor material, and a channel supply layer on the channel layer, the channel supply layer including a second nitride semiconductor material and inducing a 2-dimensional electron gas (2DEG) at the channel layer. The nitride semiconductor based power transistor may include a source electrode and a drain electrode on two opposite sides of a first region of the channel supply layer.

The resistor may include a first electrode and a second electrode on two opposite sides of a second region of the channel supply layer, and a portion of the channel layer around the second region of the channel supply layer may contain substantially no 2DEG. The 2DEG may be eliminated from the portion of the channel layer around the second region of the channel supply layer via one of a positive ion implantation process and a mesa etching operation. The resistor may further include a gate electrode on the second region of the channel supply layer, and an electron concentration of the 2DEG in the second region of the channel supply layer and a resistance of the resistor changes according to a voltage applied to the gate electrode. One of the source electrode and the drain electrode may be connected to the first electrode.

The inductor may include a coil-like 2DEG, and a first electrode and a second electrode on both ends of the coil-like 2DEG. A region between cons of the coil-like 2DEG may be a region from which 2DEG is eliminated via one of an implantation process and a mesa etching operation. One of the source electrode and the drain electrode may be connected to the first electrode. The inductor may include an insulation layer on a third region of the channel supply layer, a metal coil pattern on the insulation layer, and a first electrode connected to one end of the metal coil pattern and a second electrode connected to another end of the metal coil pattern. The 2DEG may be eliminated from the third region. The first electrode and the second electrode may be formed of metals filling holes penetrating through the insulation layer and the channel supply layer. One of the source electrode and the drain electrode may be connected to the first electrode.

The capacitor may include a dielectric layer on a fourth region of the channel supply layer, a top electrode on the dielectric layer, and a bottom electrode surrounding the fourth region of the channel supply layer and contacting the 2DEG via an inner surface of the bottom electrode. The bottom electrode may have an annular shape surrounding the top electrode. A thickness of the channel supply layer at the fourth region may be from about 20 nm to about 30 nm. One of the source electrode and the drain electrode may be connected to the bottom electrode. The first nitride semiconductor material may be a GaN-based material. The second nitride semiconductor material may be a nitride containing at least one of aluminum (Al), gallium (Ga), indium (In), and boron (B).

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
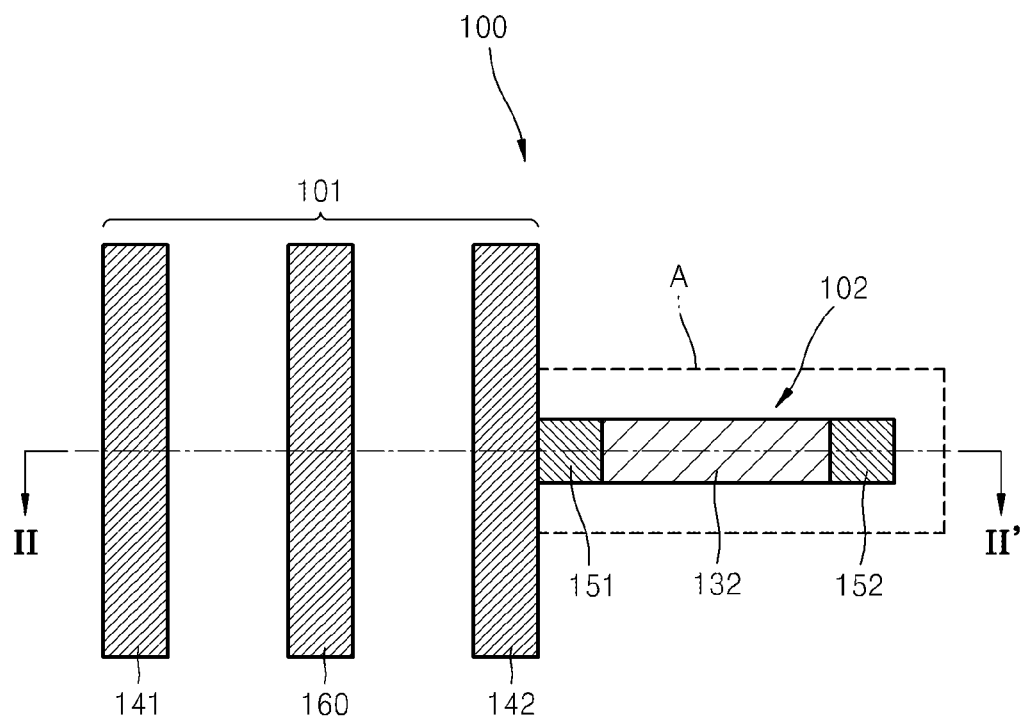
FIG. 1 is a plan view schematically showing structure of a nitride semiconductor based power converting device according to an example embodiment.

Reference will now be made in detail to embodiments, examples of which are illustrated in the accompanying drawings, wherein like reference numerals refer to the like elements throughout and sizes of elements may be exaggerated for clarity. In this regard, the present embodiments may have different forms and should not be construed as being limited to the descriptions set forth herein. Accordingly, the embodiments are merely described below, by referring to the figures, to explain aspects of the present description. Expressions such as "at least one of," when preceding a list of elements, modify the entire list of elements and do not modify the individual elements of the list.

It will be understood that, although the terms "first", "second", etc. may be used herein to describe various elements, components, regions, layers and/or sections, these elements, components, regions, layers and/or sections are not to be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments are not to be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, is to be interpreted as having a meaning that is consistent with their meaning in the context of the relevant art and will not be interpreted in an idealized or overly formal sense unless expressly so defined herein.

Figure 2:
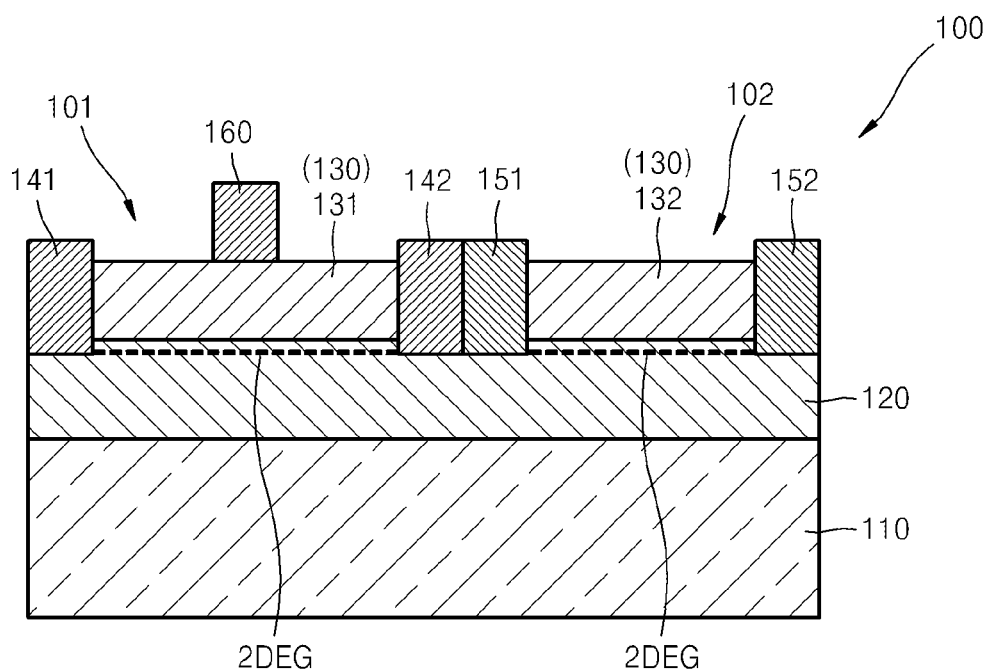
FIG. 2 is a sectional view taken along a line II-II' of FIG. 1.

FIGS. 1 and 2 are a plan view and a sectional view schematically showing structure of a nitride semiconductor based power converting device 100 according to an example embodiment. FIG. 2 is a sectional view taken along a line II-II' of FIG. 1. In FIG. 1, some components are not shown for convenience.

Referring to FIGS. 1 and 2, a channel layer 120 is formed on a substrate 110. The substrate 110 may be formed of sapphire, Si, SiC, or GaN, for example. However, the materials stated above are merely examples, and the substrate 110 may be formed of any of various other materials.

The channel layer 120 may be formed of a first nitride semiconductor material. The first nitride semiconductor material may be a Group III-V compound semiconductor material. For example, the channel layer 120 may be formed of a GaN-based material. In detail, the channel layer 120 may be a GaN layer, for example. In this case, the channel layer 120 may be an undoped GaN layer or a GaN layer doped with a given (or alternatively, predetermined) impurity, as an occasion demands.

Although not shown, a buffer layer (not shown) may be further arranged between the substrate 110 and the channel layer 120. The buffer layer is provided to prevent or inhibit deterioration of crystallinity of the channel layer 120 by reducing differences in lattice constants and thermal expansion coefficients between the substrate 110 and the channel layer 120. The buffer layer includes a nitride containing at least one among aluminum (Al), gallium (Ga), indium (In), and boron (B) and may have a single-layer structure or a multi-layer structure. The buffer layer may be formed of AlN, GaN, AlGaN, InGaN, AlInN, or AlGaInN, for example. A seed layer (not shown) for growth of the buffer layer may be further arranged between the substrate 110 and the buffer layer.

A channel supply layer 130 may be formed on the channel layer 120. The channel supply layer 130 may induce 2-dimensional electron gas (2DEG) at the channel layer 120. The 2DEG may be formed in a portion of the channel layer 120 below the interface between the channel layer 120 and the channel supply layer 130. The channel supply layer 130 may be formed of a second nitride semiconductor material, which is different from the first nitride semiconductor material constituting the channel layer 120. At least one among polarization characteristic, energy band gap, and lattice constant of the second nitride semiconductor material may be different from those of the first nitride semiconductor material. In detail, at least one of polarization rate and energy band gap of the second nitride semiconductor material may be greater than those of the first nitride semiconductor material.

The channel supply layer 130 may be formed of a nitride containing at least one among Al, Ga, In, and B and may have a single-layer structure or a multi-layer structure. In detail, the channel supply layer 130 may be formed of AlGaN, AlInN, InGaN, AlN, or AlInGaN, for example. The channel supply layer 130 may be an undoped layer or a layer doped with a given (or alternatively, predetermined) impurity. Thickness of the channel supply layer 130 may be smaller than or equal to several tens of nm. For example, thickness of the channel supply layer 130 may be smaller than or equal to 50 nm. However, thickness of the channel supply layer 130 is not limited thereto.

The nitride semiconductor based power converting device 100 includes a power transistor 101 and a resistor 102. The power transistor 101 and the resistor 102 share the substrate 110 and the channel layer 120.

The power transistor 101 includes a channel supply layer 131 formed at a first region on the channel layer 120, a source electrode 141 and a drain electrode 142 that are formed on the channel layer 120 at the two opposite sides of the channel supply layer 131, and a gate electrode 160 formed on the channel supply layer 131. A gate insulation layer may be further formed below the gate electrode 160.

The power transistor 101 shown in FIG. 1 is merely an example, and example embodiments are not limited thereto. Any of various modifications including a power transistor which shares the substrate 110 and the channel layer 120 with the resistor 102 and uses a channel supply layer different from that used by the resistor 102 are included in example embodiments.

The resistor 102 includes a channel supply layer 132 formed at a second region on the channel layer 120 and a first electrode 151 and a second electrode 152 that are formed on the channel layer 120 at two opposite sides of the channel supply layer 132. The first electrode 151 and the second electrode 152 may be electrically connected to the 2DEG. The first electrode 151 and the second electrode 152 may also be formed on the channel supply layer 130. As shown in FIG. 1, the first electrode 151 and the second electrode 152 may be formed to extend into the channel layer 120. Various other modifications may be made in configurations of the first electrode 151 and the second electrode 152.

A region A around the resistor 102 may be switched to an insulation region by eliminating 2DEG in the region A by performing implantation thereto. Ar ions, Fe ions, O ions, P ions, He ions, N ions, or H ions may be used for the implantation. Instead of performing an implantation process, a region around the resistor 102 may be removed by performing a mesa etching operation.

The drain electrode 142 of the power transistor 101 may be formed to contact the first electrode 151 of the resistor 102. Alternatively, the drain electrode 142 and the first electrode 151 may also be formed as a single common electrode. Alternatively, the drain electrode 142 and the first electrode 151 may be connected to each other via a wiring therebetween. Instead of the drain electrode 142, the source electrode 141 may be electrically connected to the first electrode 151 or the second electrode 152.

According to an example embodiment, since the nitride semiconductor based power transistor 101 and the resistor 102, which is a passive device, may be fabricated by using same layers, volume of the power converting device 100 may be reduced and configuration thereof may be simplified. Furthermore, since there is no parasitic resistance due to additional components including wires for interconnecting the power transistor 101 and other passive devices such as the resistor 102, power loss is reduced, thereby improving power converting efficiency.

Figure 3:
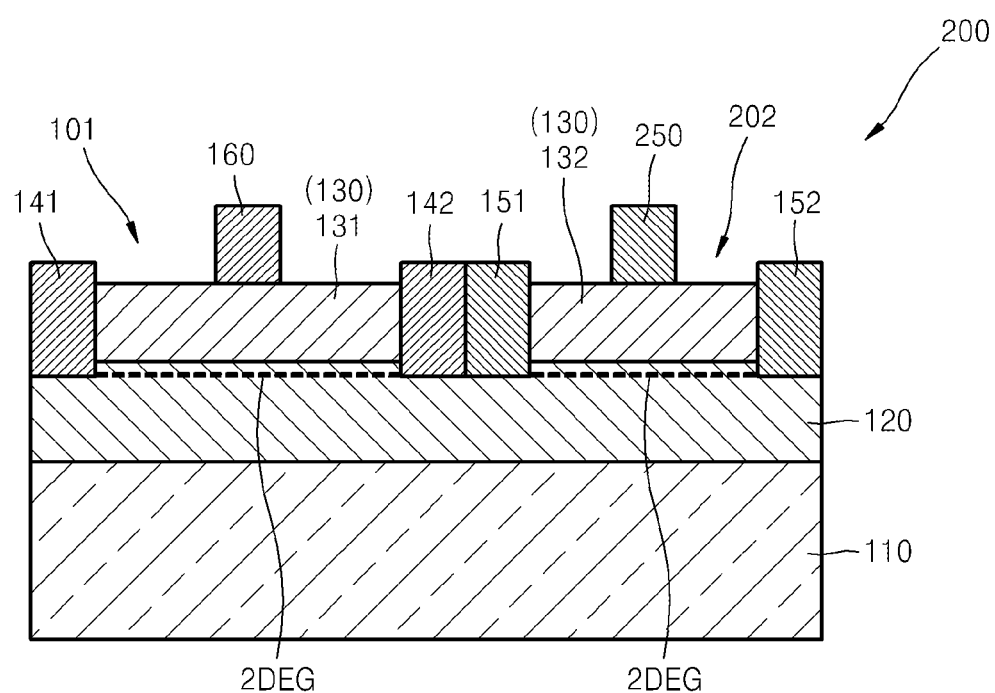
FIG. 3 is a sectional view schematically showing a configuration of a nitride semiconductor based power converting device according to another example embodiment.

FIG. 3 is a schematic sectional view showing a configuration of a nitride semiconductor based power converting device 200 according to another example embodiment. Components of the nitride semiconductor based power converting device 200 that are substantially identical to those of the nitride semiconductor based power converting device 100 of FIG. 1 will be denoted by the same reference numerals and detailed descriptions thereof will be omitted.

Referring to FIG. 3, the resistor 202 includes a third electrode 250 further formed on the channel supply layer 132. An insulation layer may be further formed between the channel supply layer 132 and the third electrode 250. When a given (or alternatively, predetermined) voltage is applied to the third electrode 250, electron concentration in the 2DEG is changed, thereby changing the resistance applied between the first electrode 151 and the second electrode 152.

Figure 4:
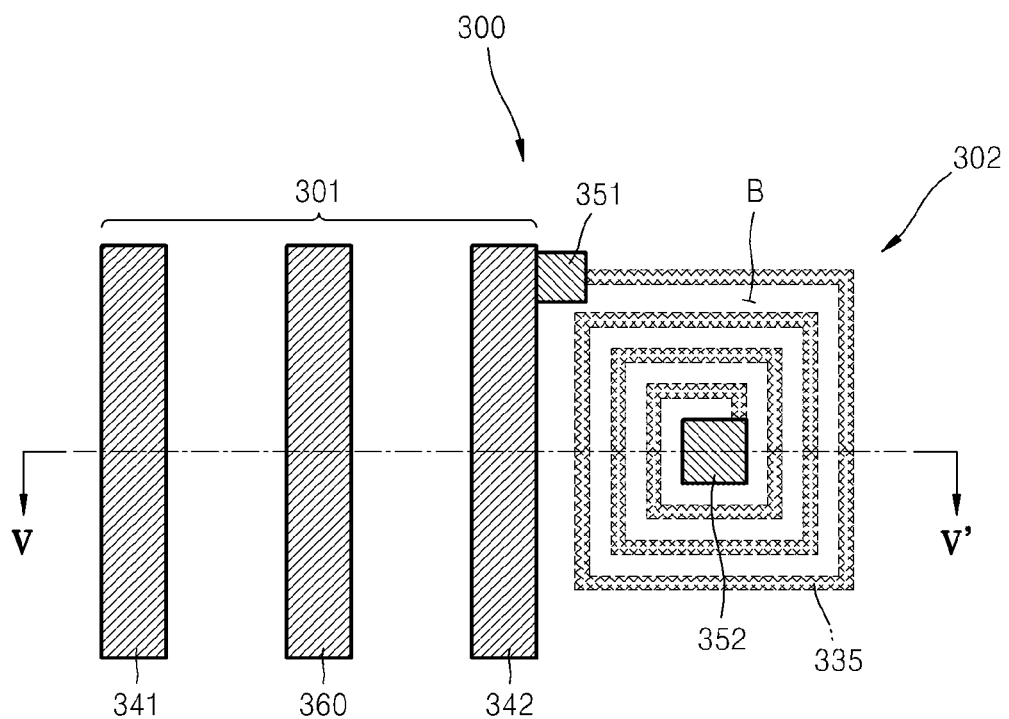
FIG. 4 is a plan view schematically showing structure of a nitride semiconductor based power converting device according to another example embodiment.
Figure 5:
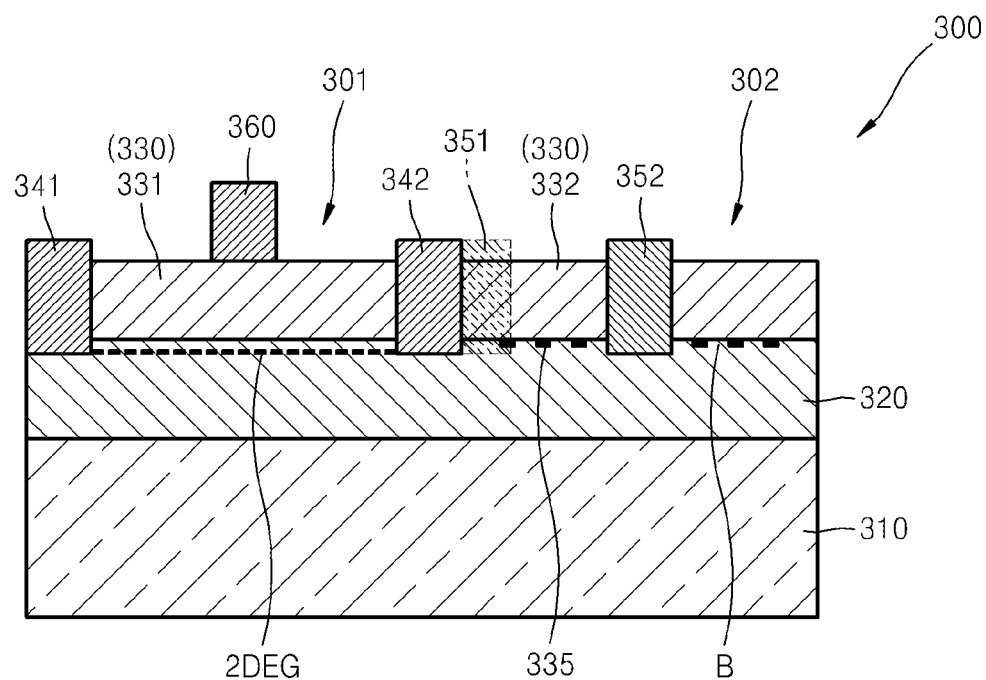
FIG. 5 is a sectional view taken along a line V-V' of FIG. 4.

FIG. 4 is a schematic plan view showing the configuration of a nitride semiconductor based power converting device 300 according to another example embodiment, and FIG. 5 is a sectional view taken along a line V-V' of FIG. 4. In FIG. 4, some components are not shown for convenience.

Referring to FIGS. 4 and 5, a channel layer 320 is formed on a substrate 310. The substrate 310 may be formed of sapphire, Si, SiC, or GaN, for example. The channel layer 320 may be formed of a first nitride semiconductor material. The first nitride semiconductor material may be a Group III-V compound semiconductor material. For example, the channel layer 320 may be formed of a GaN-based material. In detail, the channel layer 320 may be a GaN layer, for example. In this case, the channel layer 320 may be an undoped GaN layer or a GaN layer doped with a given (or alternatively, predetermined) impurity, as an occasion demands.

A channel supply layer 330 may be formed on the channel layer 320. The channel supply layer 330 may induce 2-dimensional electron gas (2DEG) at the channel layer 320. The 2DEG may be formed in a portion of the channel layer 320 below the interface between the channel layer 320 and the channel supply layer 330. The channel supply layer 330 may be formed of a second nitride semiconductor material, which is different from the first nitride semiconductor material constituting the channel layer 320. At least one among polarization characteristic, energy band gap, and lattice constant of the second nitride semiconductor material may be different from those of the first nitride semiconductor material. In detail, at least one of polarization rate and energy band gap of the second nitride semiconductor material may be greater than those of the first nitride semiconductor material.

The channel supply layer 330 may be formed of a nitride containing at least one among Al, Ga, In, and B and may have a single-layer structure or a multi-layer structure. In detail, the channel supply layer 330 may be formed of AlGaN, AlInN, InGaN, AlN, or AlInGaN, for example. The channel supply layer 330 may be an undoped layer or a layer doped with a given (or alternatively, predetermined) impurity. Thickness of the channel supply layer 330 may be smaller than or equal to several tens of nm. For example, thickness of the channel supply layer 330 may be smaller than or equal to 50 nm. However, thickness of the channel supply layer 330 is not limited thereto.

The nitride semiconductor based power converting device 300 includes a power transistor 301 and an inductor 302. The power transistor 301 and the inductor 302 share the substrate 310 and the channel layer 320.

The power transistor 301 includes a channel supply layer 331 formed at a first region on the channel layer 320, a source electrode 341 and a drain electrode 342 that are formed on the channel layer 320 at the two opposite sides of the channel supply layer 331, and a gate electrode 360 formed on the channel supply layer 331. A gate insulation layer (not shown) may be further formed below the gate electrode 360.

The power transistor shown in FIGS. 4 and 5 is merely an example, and example embodiments are not limited thereto. Any of various modifications including a power transistor which shares the substrate 310 and the channel layer 320 with the inductor 302 and uses a channel supply layer different from that used by the inductor 302 are included in example embodiments.

The inductor 302 includes a 2DEG coils 335 formed below a channel supply layer 332 at a second region on the channel layer 320 and a first electrode 351 and a second electrode 352 that are formed on the channel layer 320 at both ends of the 2DEG coils 335. The first electrode 351 and the second electrode 352 may be electrically connected to the 2DEG coils 335. The first electrode 351 and the second electrode 352 may also be formed on the channel supply layer 330. As shown in FIG. 5, the first electrode 351 and the second electrode 352 may be formed to extend into the channel layer 320. Various other modifications may be made in configurations of the first electrode 351 and the second electrode 352.

A region B between the 2DEG coils 335 is an insulation region from which 2DEG is eliminated via implantation. Ar ions, Fe ions, O ions, P ions, He ions, N ions, or H ions may be used for the implantation.

A drain electrode 342 of a power transistor 301 may be formed to contact the first electrode 351 of the inductor 302. Alternatively, the drain electrode 342 and the first electrode 351 may also be formed as a single common electrode. Alternatively, the drain electrode 342 and the first electrode 351 may be connected to each other via a wiring therebetween. Instead of the drain electrode 342, a source electrode 341 may be electrically connected to the first electrode 351 or the second electrode 352.

According to an example embodiment, since the nitride semiconductor based power transistor 301 and the inductor 302, which is a passive device, may be fabricated by using same layers, volume of the power converting device 300 may be reduced and configuration thereof may be simplified.

Figure 6:
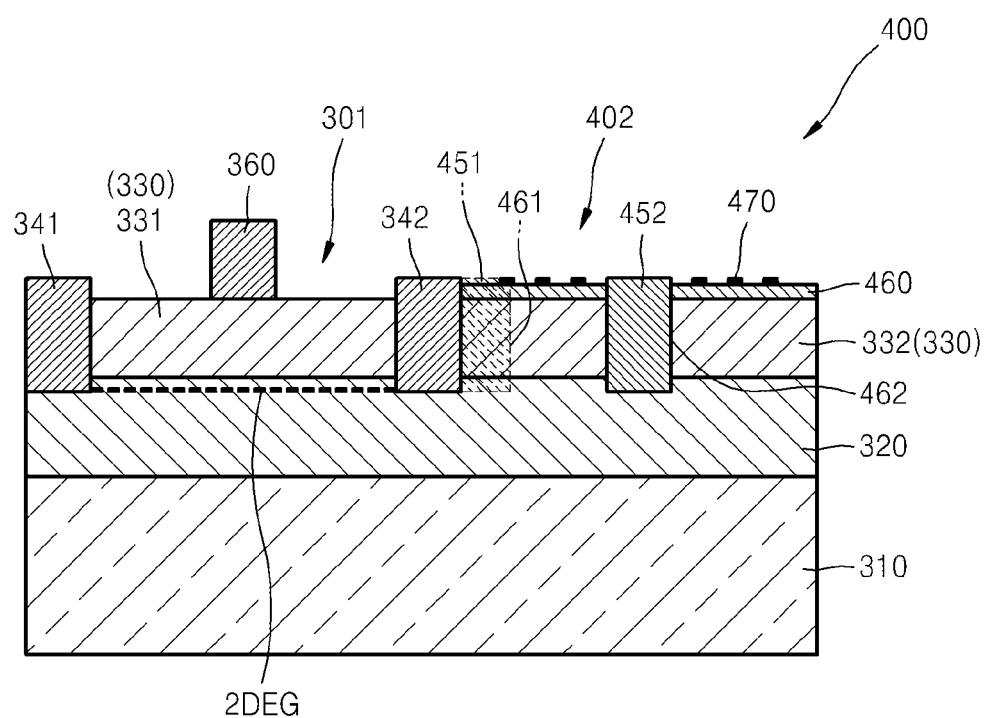
FIG. 6 is a sectional view schematically showing structure of a nitride semiconductor based power converting device according to another example embodiment.

FIG. 6 is a schematic sectional view of a nitride semiconductor based power converting device 400 according to another example embodiment. Components of the nitride semiconductor based power converting device 400 that are identical to those of the nitride semiconductor based power converting device 300 of FIG. 5 will be denoted by the same reference numerals and detailed descriptions thereof will be omitted.

Referring to FIG. 6, the nitride semiconductor based power converting device 400 includes a power transistor 301 and an inductor 402. The power transistor 301 and the inductor 402 share the substrate 310 and the channel layer 320.

Although 2DEG is formed at the channel layer 320 of the power transistor 301, no 2DEG is formed in the portion of the channel layer 320 below a channel supply layer 332 at the second region. The 2DEG at the second region may be eliminated via positive ion implantation.

The channel supply layer 332 at the second region may be formed to have the same thickness as the channel supply layer 331 at the first region or may be formed to have a smaller thickness than the channel supply layer 331 at the first region.

An insulation layer 460 is formed on the channel supply layer 332. The inductor 402 includes a metal coil pattern 470 formed on the insulation layer 460. The metal coil pattern 470 may be formed by forming a metal thin-film on the insulation layer 460 and patterning the metal thin-film.

The metal coil pattern 470 may be formed to have the same shape as that of the 2DEG coils 335 of FIG. 4. A first electrode 451 and a second electrode 452 are formed at two opposite ends of the metal coil pattern 470.

As shown in FIG. 6, the first electrode 451 and the second electrode 452 may be metals respectively filling holes 461 and 462 penetrating through the channel supply layer 332 and the insulation layer 460. The first electrode 451 and the second electrode 452 may be formed to enter into the channel layer 320.

The drain electrode 342 of the power transistor 301 may be formed to contact the first electrode 351 of the inductor 402. Alternatively, the drain electrode 342 and the first electrode 351 may also be formed as a single common electrode. Alternatively, the drain electrode 342 and the first electrode 351 may be connected to each other via a wiring therebetween. Instead of the drain electrode 342, a source electrode 341 may be electrically connected to the first electrode 451 or the second electrode 452.

Figure 7:
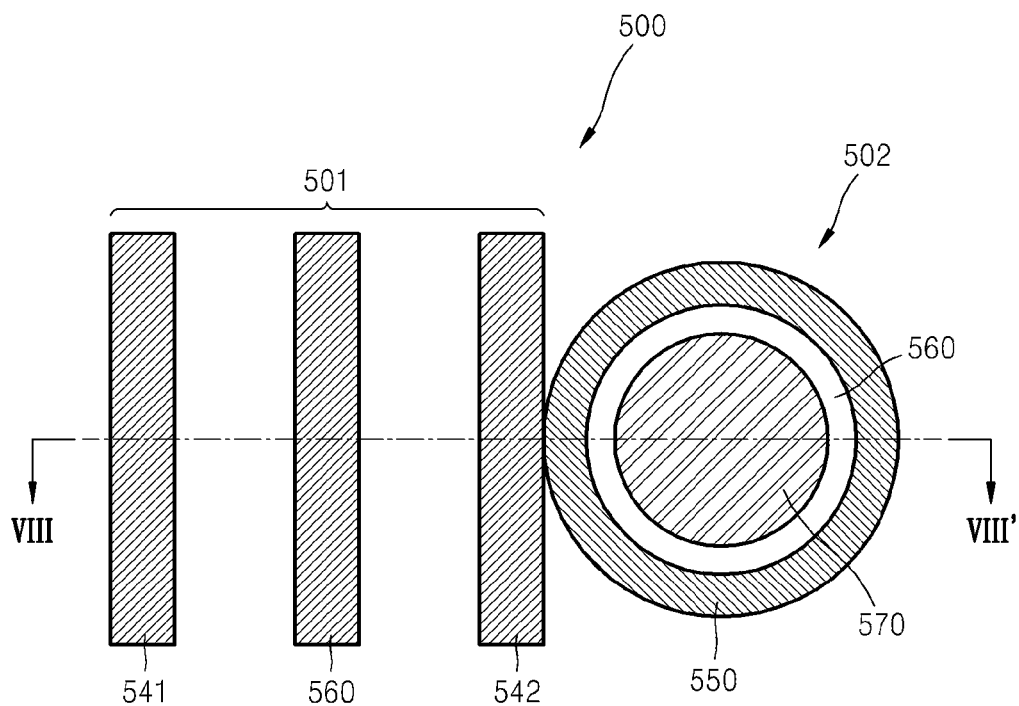
FIG. 7 is a plan view schematically showing structure of a nitride semiconductor based power converting device according to another example embodiment.
Figure 8:
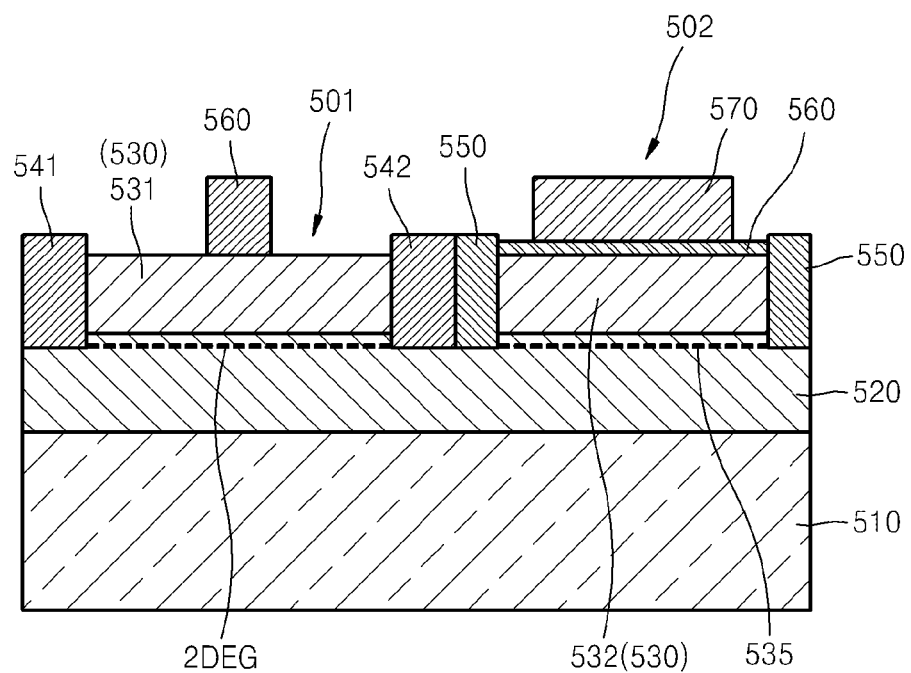
FIG. 8 is a sectional view taken along a line VIII-VIII' of FIG. 7.

FIG. 7 is a schematic plan view showing the configuration of a nitride semiconductor based power converting device 500 according to another example embodiment, and FIG. 8 is a sectional view taken along a line VIII-VIII' of FIG. 7. In FIG. 7, some components are not shown for convenience.

Referring to FIGS. 7 and 8, a channel layer 520 is formed on a substrate 510. The substrate 510 may be formed of sapphire, Si, SiC, or GaN, for example. The channel layer 520 may be formed of a first nitride semiconductor material. The first nitride semiconductor material may be a Group III-V compound semiconductor material. For example, the channel layer 520 may be formed of a GaN-based material. In detail, the channel layer 520 may be a GaN layer, for example. In this case, the channel layer 520 may be an undoped GaN layer or a GaN layer doped with a given (or alternatively, predetermined) impurity, as an occasion demands.

A channel supply layer 530 may be formed on the channel layer 520. The channel supply layer 530 may induce 2-dimensional electron gas (2DEG) at the channel layer 520. The 2DEG may be formed in a portion of the channel layer 520 below the interface between the channel layer 520 and the channel supply layer 530. The channel supply layer 530 may be formed of a second nitride semiconductor material, which is different from the first nitride semiconductor material constituting the channel layer 520. At least one among polarization characteristic, energy band gap, and lattice constant of the second nitride semiconductor material may be different from those of the first nitride semiconductor material. In detail, at least one of polarization rate and energy band gap of the second nitride semiconductor material may be greater than those of the first nitride semiconductor material.

The channel supply layer 530 may be formed of a nitride containing at least one among Al, Ga, In, and B and may have a single-layer structure or a multi-layer structure. In detail, the channel supply layer 530 may be formed of AlGaN, AlInN, InGaN, AlN, or AlInGaN, for example. The channel supply layer 530 may be an undoped layer or a layer doped with a given (or alternatively, predetermined) impurity. Thickness of the channel supply layer 530 may be smaller than or equal to dozens of nm. For example, thickness of the channel supply layer 530 may be smaller than or equal to 50 nm. However, thickness of the channel supply layer 530 is not limited thereto.

The nitride semiconductor based power converting device 500 includes a power transistor 501 and a capacitor 502. The power transistor 501 and the capacitor 502 share the substrate 510 and the channel layer 520.

The power transistor 501 includes a channel supply layer 531 formed at a first region on the channel layer 520, a source electrode 541 and a drain electrode 542 that are formed on the channel layer 520 at the two opposite sides of the channel supply layer 531, and a gate electrode 560 formed on the channel supply layer 531. A gate insulation layer may be further formed below the gate electrode 560.

The capacitor 502 includes a bottom electrode 550 covering a channel supply layer 532 at a second region of the channel layer 520, a 2DEG 535 formed to contact the inner surface of the bottom electrode 550, a dielectric layer 560 arranged on the channel supply layer 532, and a top electrode 570 on the dielectric layer 560. The bottom electrode 550 has a ring-like shape surrounding the top electrode 570. The bottom electrode 550 is apart from the top electrode 570. The bottom electrode 550 and the 2DEG 535 formed inside the bottom electrode 550 constitute the bottom electrode of the capacitor 502.

The channel supply layer 532 is formed to have a thickness that is sufficiently small not to affect permittivity of the dielectric layer 560. The channel supply layer 532 may be formed to be thinner than the channel supply layer 531. For example, the channel supply layer 532 may be formed to have a thickness from about 20 nm to about 30 nm.

The dielectric material 560 is formed of a common dielectric material. For example, the dielectric material 560 may be formed of silicon oxide, alumina, or hafnium oxide.

The bottom electrode 550 may contact the drain electrode 542 or may be connected to the drain electrode 542 via a wiring between the bottom electrode 550 and the drain electrode 542.

Although the capacitor 502 has a circular shape in FIG. 7, example embodiments are not limited thereto. For example, the capacitor 502 may have a rectangular shape.

According to an example embodiment, since the nitride semiconductor based power transistor 501 and the capacitor 502, which is a passive device, may be fabricated by using same layers, volume of the power converting device 500 may be reduced. Furthermore, since the capacitor 502 is fabricated without using an additional component, parasitic resistance may be eliminated. Furthermore, configuration of the power converting device 500 may be simplified.

An example embodiment provides a nitride semiconductor based power converting device in which a nitride semiconductor based power transistor and a passive device are fabricated by using same layers.

Since a nitride semiconductor based power transistor and a passive device may be fabricated by using the same layers, volume of the power converting device may be reduced and configuration thereof may be simplified. Furthermore, power converting efficiency may be improved.

It should be understood that the example embodiments described therein should be considered in a descriptive sense only and not for purposes of limitation. Descriptions of features or aspects within each embodiment should typically be considered as available for other similar features or aspects in other embodiments.

What is claimed is:

1. A nitride semiconductor based power converting device comprising:
a nitride semiconductor based power transistor; and
at least one nitride semiconductor based passive device, wherein
the at least one nitride semiconductor based passive device is one of a resistor, an inductor, and a capacitor,
the at least one nitride semiconductor based passive device and the nitride semiconductor based power transistor include a channel layer including a first nitride semiconductor material, and a channel supply layer on the channel layer, the channel supply layer including a second nitride semiconductor material and inducing a 2-dimensional electron gas (2DEG) at the channel layer,
the nitride semiconductor based power transistor includes a source electrode and a drain electrode on two opposite sides of a first region of the channel supply layer,
the resistor includes a first electrode and a second electrode on two opposite sides of a second region of the channel supply layer, and
a portion of the channel layer around the second region of the channel supply layer contains substantially no 2DEG.

2. The nitride semiconductor based power converting device of claim 1, wherein the 2DEG is eliminated from the portion of the channel layer around the second region of the channel supply layer via one of a positive ion implantation process and a mesa etching operation.

3. The nitride semiconductor based power converting device of claim 1, wherein the resistor further comprises:
a gate electrode on the second region of the channel supply layer,
wherein an electron concentration of the 2DEG in the second region of the channel supply layer and a resistance of the resistor changes according to a voltage applied to the gate electrode.

4. The nitride semiconductor based power converting device of claim 1, wherein one of the source electrode and the drain electrode is connected to the first electrode.

5. A nitride semiconductor based power converting device comprising:
a nitride semiconductor based power transistor; and
at least one nitride semiconductor based passive device, wherein
the at least one nitride semiconductor based passive device is one of a resistor, an inductor, and a capacitor,
the at least one nitride semiconductor based passive device and the nitride semiconductor based power transistor include a channel layer including a first nitride semiconductor material, and a channel supply layer on the channel layer, the channel supply layer including a second nitride semiconductor material and inducing a 2-dimensional electron gas (2DEG) at the channel layer,
the nitride semiconductor based power transistor includes a source electrode and a drain electrode on two opposite sides of a first region of the channel supply layer, and
the inductor includes,
a coil-like 2DEG, and
a first electrode and a second electrode on both ends of the coil-like 2DEG.

6. The nitride semiconductor based power converting device of claim 5, wherein a region between coils of the coil-like 2DEG is a region from which 2DEG is eliminated via one of an implantation process and a mesa etching operation.

7. The nitride semiconductor based power converting device of claim 5, wherein one of the source electrode and the drain electrode is connected to the first electrode.

8. A nitride semiconductor based power converting device comprising:
a nitride semiconductor based power transistor; and
at least one nitride semiconductor based passive device, wherein
the at least one nitride semiconductor based passive device is one of a resistor, an inductor, and a capacitor,
the at least one nitride semiconductor based passive device and the nitride semiconductor based power transistor include a channel layer including a first nitride semiconductor material, and a channel supply layer on the channel layer, the channel supply layer including a second nitride semiconductor material and inducing a 2-dimensional electron gas (2DEG) at the channel layer, the nitride semiconductor based power transistor includes a source electrode and a drain electrode on two opposite sides of a first region of the channel supply layer, and the inductor comprises,
 an insulation layer on a third region of the channel supply layer,
 a metal coil pattern on the insulation layer, and
 a first electrode connected to one end of the metal coil pattern and a second electrode connected to another end of the metal coil pattern,
 wherein the 2DEG is eliminated from the third region.

9. The nitride semiconductor based power converting device of claim 8, wherein the first electrode and the second electrode are formed of metals filling holes penetrating through the insulation layer and the channel supply layer.

10. The nitride semiconductor based power converting device of claim 8, wherein one of the source electrode and the drain electrode is connected to the first electrode.

11. A nitride semiconductor based power converting device of comprising:
 a nitride semiconductor based power transistor; and
 at least one nitride semiconductor based passive device, wherein
 the at least one nitride semiconductor based passive device is one of a resistor, an inductor, and a capacitor,
 the at least one nitride semiconductor based passive device and the nitride semiconductor based power transistor include a channel layer including a first nitride semiconductor material, and a channel supply layer on the channel layer, the channel supply layer including a second nitride semiconductor material and inducing a 2-dimensional electron gas (2DEG) at the channel layer,
 the nitride semiconductor based power transistor includes a source electrode and a drain electrode on two opposite sides of a first region of the channel supply layer, and
 wherein the capacitor comprises,
  a dielectric layer on a fourth region of the channel supply layer,
  a top electrode on the dielectric layer, and
  a bottom electrode surrounding the fourth region of the channel supply layer and contacting the 2DEG via an inner surface of the bottom electrode.

12. The nitride semiconductor based power converting device of claim 11, wherein the bottom electrode has an annular shape surrounding the top electrode.

13. The nitride semiconductor based power converting device of claim 11, wherein a thickness of the channel supply layer at the fourth region is from about 20 nm to about 30 nm.

14. The nitride semiconductor based power converting device of claim 11, wherein one of the source electrode and the drain electrode is connected to the bottom electrode.

15. The nitride semiconductor based power converting device of claim 1, wherein the first nitride semiconductor material is a GaN-based material.

16. The nitride semiconductor based power converting device of claim 1, wherein the second nitride semiconductor material is a nitride containing at least one of aluminum (Al), gallium (Ga), indium (In), and boron (B).

* * * * *